United States Patent
Dicicco et al.

(10) Patent No.: US 10,491,209 B2
(45) Date of Patent: Nov. 26, 2019

(54) SWITCH LINEARIZER

(71) Applicant: QUALCOMM Incorporated, San Diego, CA (US)

(72) Inventors: Marc Gerald Dicicco, Dunstable, MA (US); Xiangdong Zhang, Westford, MA (US); Xinwei Wang, Dunstable, MA (US)

(73) Assignee: QUALCOMM Incorporated, San Diego, CA (US)

( * ) Notice: Subject to any disclaimer, the term of this patent is extended or adjusted under 35 U.S.C. 154(b) by 792 days.

(21) Appl. No.: 13/944,709

(22) Filed: Jul. 17, 2013

(65) Prior Publication Data

US 2015/0022024 A1    Jan. 22, 2015

(51) Int. Cl.
    *H03K 17/16*     (2006.01)
(52) U.S. Cl.
    CPC ........... *H03K 17/16* (2013.01); *H03K 17/162* (2013.01)
(58) Field of Classification Search
    CPC ... H01L 29/94; H01L 129/94; H01L 127/108; H03K 17/16
    USPC ........................................................ 307/109
    See application file for complete search history.

(56) References Cited

U.S. PATENT DOCUMENTS

| | | | |
|---|---|---|---|
| 7,109,944 B2 | 9/2006 | Sato et al. | |
| 7,557,773 B2 | 7/2009 | Sekiguchi et al. | |
| 7,902,585 B2 | 3/2011 | Larson et al. | |
| 8,253,506 B2 * | 8/2012 | Liu | H03L 1/023 331/117 R |
| 8,269,683 B2 | 9/2012 | McKinzie et al. | |
| 8,405,563 B2 | 3/2013 | McKinzie et al. | |
| 2009/0128992 A1 | 5/2009 | Haralabidis et al. | |
| 2009/0181630 A1 | 7/2009 | Seshita et al. | |
| 2011/0316062 A1 * | 12/2011 | Kondo | H01L 29/93 257/312 |
| 2012/0051105 A1 | 3/2012 | Mednik et al. | |
| 2012/0252384 A1 | 10/2012 | Burgener et al. | |
| 2014/0266415 A1 * | 9/2014 | Kerr | H03H 11/1213 327/552 |

FOREIGN PATENT DOCUMENTS

| | | | |
|---|---|---|---|
| CN | 102832919 A | | 12/2012 |
| JP | 2003218217 A | | 7/2003 |
| JP | 2009194891 A | | 8/2009 |
| JP | 2011015289 A | | 1/2011 |
| JP | 2011040811 A | * | 2/2011 |
| JP | 2013070248 A | | 4/2013 |

OTHER PUBLICATIONS

International Search Report and Written Opinion for International Application No. PCT/US2014/045472, ISA/EPO, dated Sep. 26, 2014, 13 pages.

* cited by examiner

*Primary Examiner* — Daniel Kessie
*Assistant Examiner* — Swarna N Chowdhuri
(74) *Attorney, Agent, or Firm* — Qualcomm Incorporated—Toler

(57) ABSTRACT

Exemplary embodiments are related to switch linearizer. A device may include at least one switch. The device may further include a linearizer coupled to the at least one switch and configured to cancel at least a portion of distortion generated by the at least one switch in an off-state.

17 Claims, 7 Drawing Sheets

SWITCH LINEARIZER

BACKGROUND

FIELD

The present invention relates generally to improving the linearity of a transistor switch in an off-state.

Metal-Oxide Semiconductor Field Effect Transistor (MOSFET) technology can be found in many electronics including microprocessors, microcontrollers, static RAM, and other digital logic circuits. Due to high noise immunity and low static power consumption, MOSFET are often used in designs to switch between one of a plurality of signals. Popular switches using MOSFETs include complementary metal-oxide semiconductor (CMOS) switches.

CMOS switches are often used in antenna tuning circuits, which require high linearity (i.e., low distortion) to allow for coexistence of several operating frequencies while maintaining a low receiver noise/spur floor and also satisfying regulatory emission masks. One limitation arises due to the nonlinear capacitance of a CMOS switch in an "off" state. Conventional methods of enhancing CMOS switch linearity include use of CMOS silicon on insulator (SOI), and optimizing gate and body voltages for the lowest distortion and/or stacking more field-effect transistors (FETs) in series to reduce individual FET voltage swings. However, these methods have provided limited results and add additional loss to a network.

A need exists for improving the linearity of a switch in an off-state. More specifically, a need exists for embodiments related to improving the linearity of an antenna tuning circuit including one or more switches.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

As will be appreciated by a person having ordinary skill in the art, an antenna tuner (e.g., an impedance matching circuit) of a wireless device may include radio-frequency (RF) matrix switches, which may require high linearity (i.e. low distortion) to allow for co-existence of several operating frequencies while maintaining a low receiver noise/spur floor and meeting regulatory emission masks.

Exemplary embodiments, as described herein, are directed to devices and methods related to improving an "off" state response of a switch. According to one exemplary embodiment, a device may include at least one switch and a linearizer coupled to the switch. Further, the linearizer may be configured to cancel at least a portion of third-order distortion generated by the at least one switch. According to another exemplary embodiment, a device may include a switch including a plurality of stacked transistors configured to operate in one of an on-state and an off-state. The device may also include a varactor coupled to the switch and configured to substantially cancel third-order distortion generated by the switch in the off-state.

According to another exemplary embodiment, the present invention includes methods for improving an "off" state response of a switch. Various embodiments of such a method may include configuring at least one switch in an off-state. The method may also include substantially cancelling third-order distortion of the switch in the off-state with third-order distortion of a varactor. According to yet another exemplary embodiment, a method may include generating third-order distortion with a switch in an off-state and substantially cancelling the third-order distortion generated by the switch with a varactor coupled thereto.

Other aspects, as well as features and advantages of various aspects, of the present invention will become apparent to those of skill in the art through consideration of the ensuing description, the accompanying drawings and the appended claims.

Figure 1:
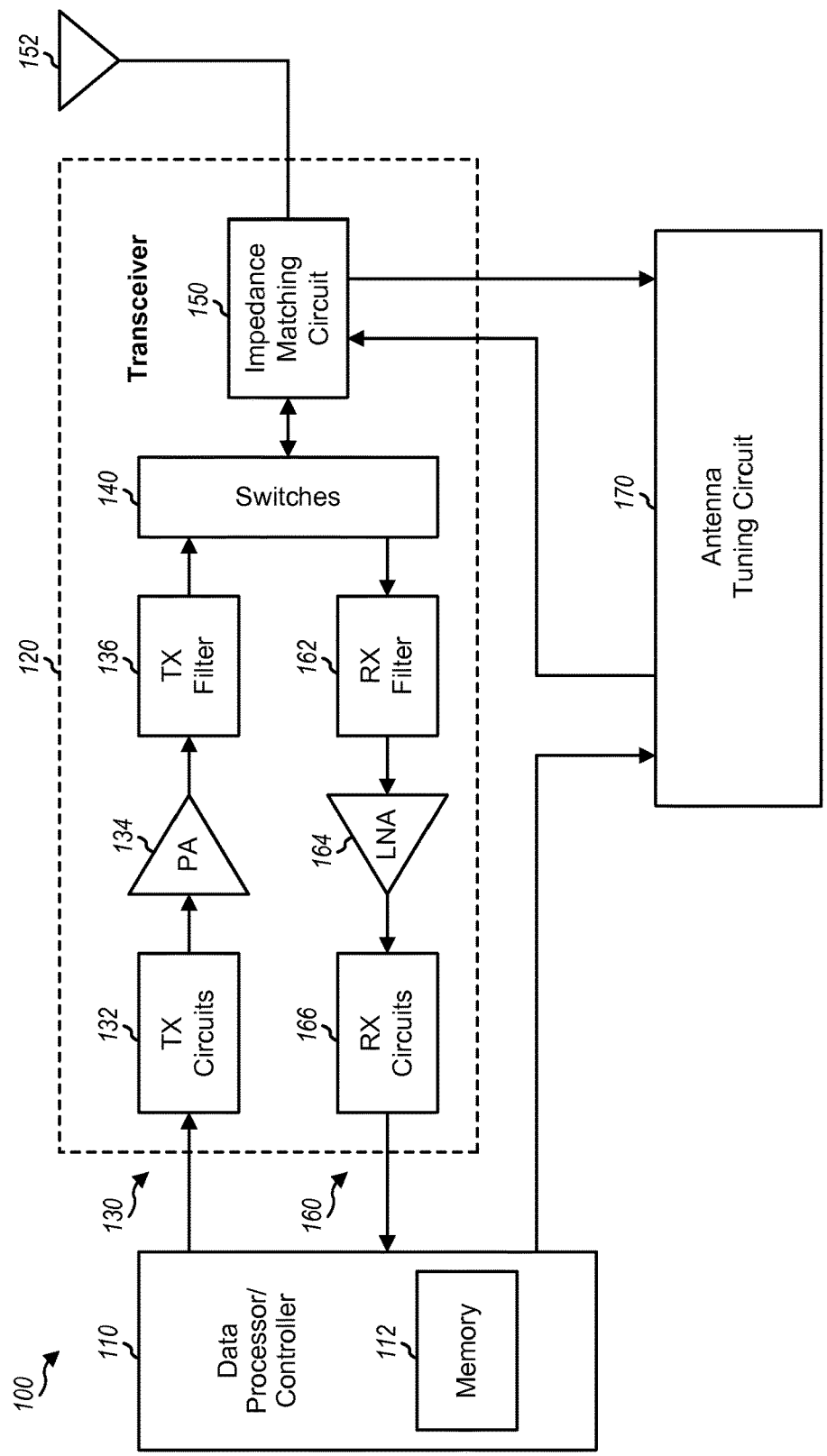
FIG. 1 illustrates a wireless device including an impedance matching circuit, in accordance with an exemplary embodiment of the present invention.

FIG. 1 shows a block diagram of an exemplary design of a wireless device 100.

In this exemplary design, wireless device 100 includes a data processor/controller 110, a transceiver 120, an adaptive tuning circuit 170, and an antenna 152. Transceiver 120 includes a transmitter 130 and a receiver 160 that support bi-directional wireless communication. Wireless device 100 may support Long Term Evolution (LTE), Code Division Multiple Access (CDMA) 1X or cdma2000, Wideband CDMA (WCDMA), Global System for Mobile Communications (GSM), IEEE 802.11, etc.

In the transmit path, data processor 110 processes (e.g., encodes and modulates) data to be transmitted and provides an analog output signal to transmitter 130. Within transmitter 130, transmit circuits 132 amplify, filter, and up-convert the analog output signal from baseband to RF and provide a modulated signal. Transmit circuits 132 may include amplifiers, filters, mixers, an oscillator, a local oscillator (LO) generator, a phase locked loop (PLL), etc. A power amplifier (PA) 134 receives and amplifies the modulated signal and provides an amplified RF signal having the proper output power level. Transmit filter 136 filters the amplified RF signal to pass signal components in a transmit band and attenuates signal components in a receive band. Transmit filter 136 provides an output RF signal, which is routed through switches 140 and an impedance matching circuit 150 and transmitted via antenna 152. Impedance matching circuit 150 performs impedance matching for antenna 152 and is also referred to as an antenna tuning circuit, a tunable matching circuit, etc.

In the receive path, antenna 152 receives signals from base stations and/or other transmitter stations and provides a received RF signal, which is routed through impedance matching circuit 150 and switches 140 and provided to receiver 160. Within receiver 160, a receive filter 162 filters the received RF signal to pass signal components in the receive band and attenuate signal components in the transmit band. An LNA 164 amplifies a filtered RF signal from receive filter 162 and provides an input RF signal. Receive circuits 166 amplify, filter, and down-convert the input RF signal from RF to baseband and provide an analog input signal to data processor 110. Receive circuits 166 may include amplifiers, filters, mixers, an oscillator, an LO generator, a PLL, etc.

Adaptive tuning circuit 170 tunes or adjusts impedance matching circuit 150 such that good performance can be achieved for data transmission and reception. Impedance matching circuit 150 may include a digital variable capacitor (DVC) (not shown in FIG. 1) having a capacitance that can be varied in discrete units with a digital control signal. In addition, according to an exemplary embodiment of the present invention, impedance matching circuit 150 may include one or more of device 400, as described below with reference to FIG. 5, one or more of device 450, as described below with reference to FIG. 6, one or more of device 500, as described below with reference to FIG. 7, or a combination thereof.

All or a portion of transceiver 120 and adaptive tuning circuit 170 may be implemented on one or more analog integrated circuits (ICs), RF ICs (RFICs), mixed-signal ICs, etc. Power amplifier 134 and possibly other circuits may be implemented on a separate IC or module. Impedance matching circuit 150 and possibly other circuits may also be implemented on a separate IC or module.

Data processor/controller 110 may perform various functions for wireless device 100. For example, data processor 110 may perform processing for data being transmitted via transmitter 130 and received via receiver 160. Controller 110 may control the operation of TX circuits 132, RX circuits 166, switches 140, and/or adaptive tuning circuit 170. Memory 112 may store program codes and data for data processor/controller 110. Memory 112 may be internal to data processor/controller 110 (as shown in FIG. 1) or external to data processor/controller 110 (not shown in FIG. 1). Data processor/controller 110 may be implemented on one or more application specific integrated circuits (ASICs) and/or other ICs.

Figure 2A:
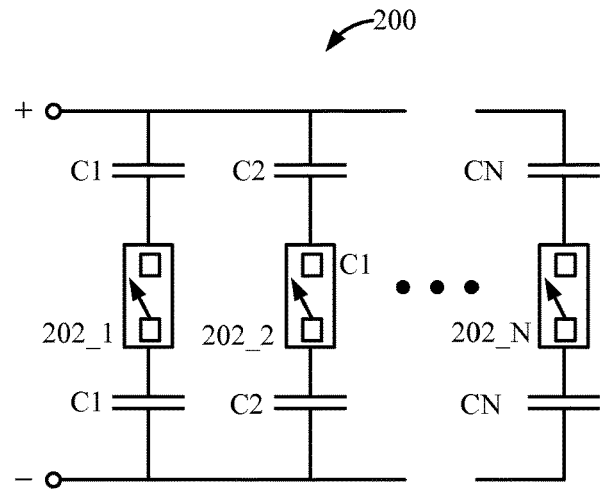
FIG. 2A depicts a digital variable capacitor circuit.

FIG. 2A illustrates a digital variable capacitor (DVC) circuit 200 including a plurality of switches 202_1-202_N and capacitors C1-CN. As will be understood by a person having ordinary skill in the art, during operation of a DVC circuit, such as DVC circuit 200, one or more of switches 202_1-202_N may operate in an on-state (i.e., in a conductive state), one or more switches 202_1-202_N may operate in an off-state (i.e., in a non-conductive state), or any combination thereof. As will be further understood, a switch, such as a switch of a DVC circuit (e.g., switch 202_N), may include a plurality of field-effect transistors (FET) in a stacked configuration.

Figure 2B:
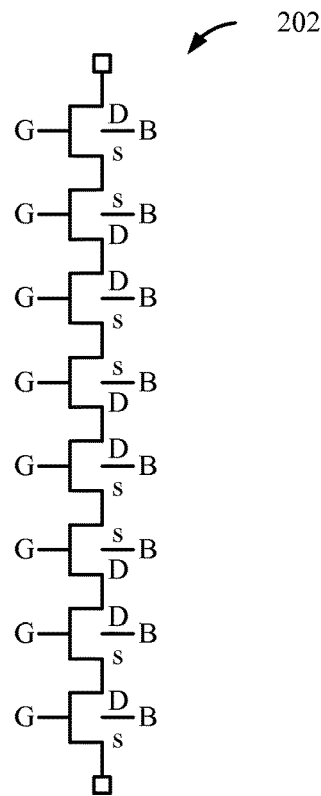
FIG. 2B illustrates a stacked field-effect transistor switch.

FIG. 2B is a more detailed illustration of a switch 202, which comprises a stacked FET switch (i.e., a plurality of FET transistors in a stacked configuration). As illustrated in FIG. 2B, each FET transistor of switch 202 may include a gate G, a body B, a drain D, and a source S, as will be understood by a person having ordinary skill in the art.

As will be appreciated by a person having ordinary skill in the art, stacked FETs are used for reliability, thereby avoiding junction breakdown failures. Further, $2^{nd}$ order nonlinearity may be substantially cancelled through symmetrical design. However, a stacked FET switch may exhibit $3^{rd}$ order nonlinearity in an off-state. Stated another way, a switch in an off-state (i.e., a switch in a non-conductive state) may be dominated by capacitive nonlinearity of drain/source (D/S) to gate and D/S to bulk capacitance. The $3^{rd}$ order nonlinearity of a stacked FET switch may comprise a summation of the $3^{rd}$ order nonlinearity of each FET in the stacked FET.

Figure 3A:
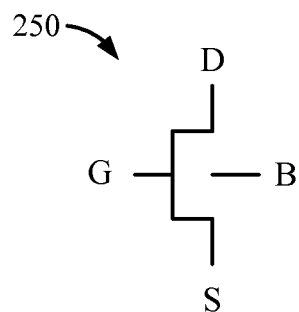
FIG. 3A depicts a field-effect transistor including a gate, a source, a drain, and a body.

FIG. 3A illustrates a transistor 250 including a gate G, a drain D, a source S, and a body B. Transistor 250 may be one of a plurality of transistors of a stacked FET switch, such as stacked FET switch 202 illustrated in FIG. 2B. By way of example only, during an off-state of transistor 250 (i.e., a non-conductive state), gate G and body B of transistor 250 may be biased with a negative voltage (e.g., −2.7 volts) to prevent partial turn-on of transistor 250.

Figure 3B:
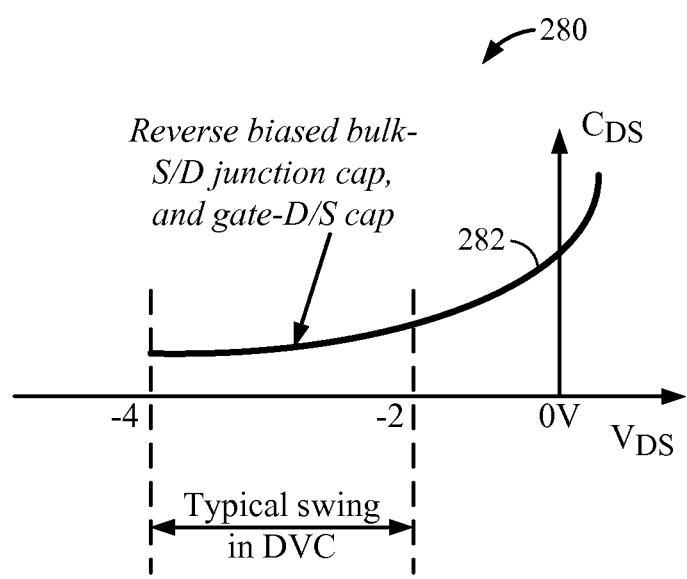
FIG. 3B is a plot depicting a drain-to-source capacitance of an off-state switch relative to a drain-to-source voltage across the off-state switch.

FIG. 3B is a plot 280 including a curve 282 that represents the drain-to-source capacitance of an off-state switch versus the D/S voltage across the off-state switch. As will be understood, curve 282 depicts the non-linear behavior of the drain-to-source capacitance of the off-state switch. As would be apparent to person having ordinary skill in the art, non-linearity of a switch within a matching circuit adds to unwanted distortion that may adversely effect receiver performance and/or cause spectral emission violations at the transmitter. The capacitance of an off-state switch as a function of voltage is given by the following equation:

$$C(V)=C0+C1*V+C2*V^2+C3*V^3; \quad (1)$$

wherein C0 is a base capacitance of the off-state switch, C1 is the linear slope of the off-state capacitance of the off-state switch, C2 is the coefficient for second order non-linear capacitance of the off-state switch, and C3 is the coefficient for $3^{rd}$ order non-linear capacitance of the off-state switch.

It is noted that the coefficient for the $3^{rd}$ order term of equation (1) (i.e., C3), which is dictated by the nature of the D/S capacitance behavior, is a positive value resulting in a concave up curve (i.e., curve 282) illustrated in plot 280.

Figure 4:
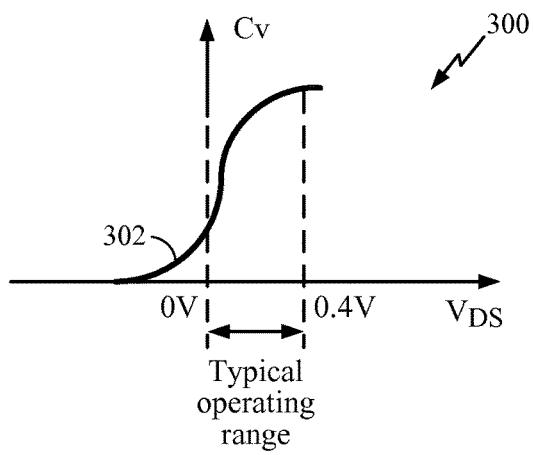
FIG. 4 is a plot depicting a capacitance of a varactor relative to a tuning voltage.

According to one exemplary embodiment, an off-state of a switch may be linearized by introducing $3^{rd}$ order distortion having substantially equal magnitude and opposite phase (i.e., shifted 180 degrees) of the off-state switch. FIG. 4 is a plot 300 including a curve 302 that represents the gate to drain/source (D/S) capacitance of a varactor versus a tuning voltage of the varactor. The capacitance of a varactor as a function of voltage is given by the following equation:

$$C(V)=C0+C1*V+C2*V^2-C3*V^3; \quad (2)$$

wherein C0 is a base capacitance of the varactor, C1 is the linear slope of the capacitance of the varactor, C2 is the coefficient for second order non-linear capacitance of the varactor, and C3 is the coefficient for $3^{rd}$ order non-linear capacitance of the varactor switch.

It is noted that the coefficient for the $3^{rd}$ order term of equation (2) (i.e., C3), which is dictated by the nature of the varactor behavior, is a negative value resulting in a concave down curve (i.e., curve 302) illustrated in plot 300. It is further noted that curve 282 of plot 280 (see FIG. 2B) and curve 302 of plot 300 (see FIG. 4) have substantially opposite inflection points. Therefore, in accordance with various exemplary embodiments of the present invention, distortion generated by a varactor may be utilized to substantially cancel distortion generated by a switch. Stated another way, a switch may be linearized by introducing distortion having an equal magnitude and an opposite phase (i.e., shifted 180 degrees) of distortion generated by the switch.

Figure 5:
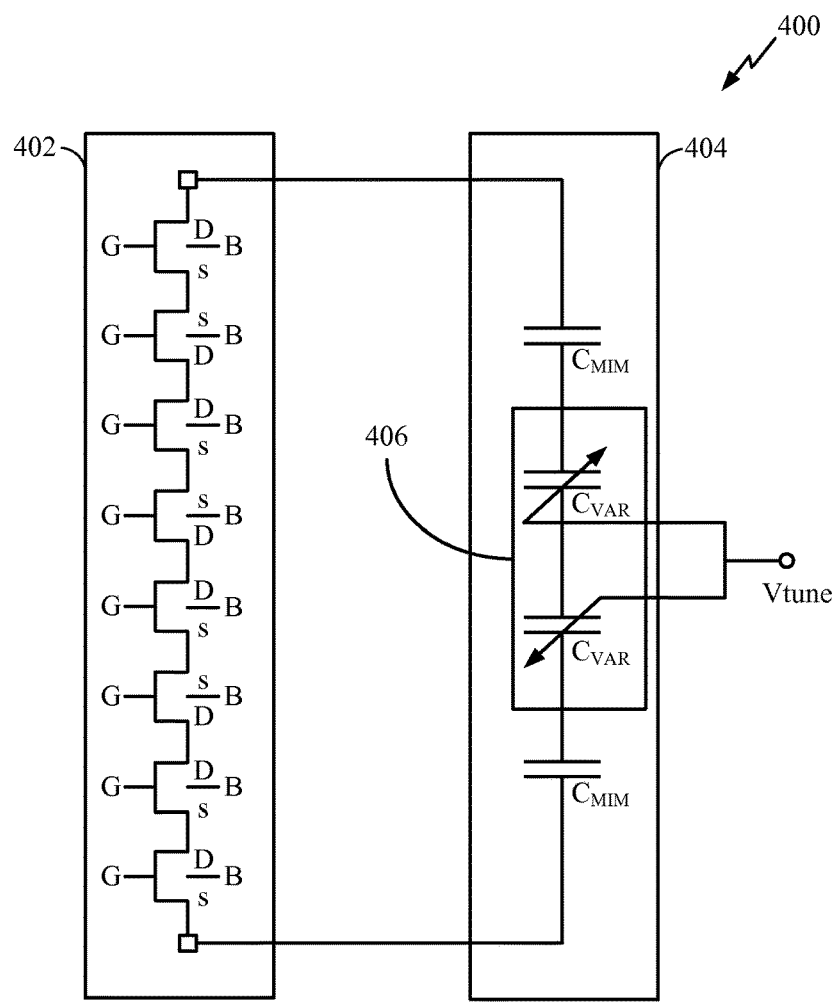
FIG. 5 illustrates a device including a switch coupled to a linearizer, in accordance with an exemplary embodiment of the present invention.

FIG. 5 illustrates a device 400, according to an exemplary embodiment of the present invention. Device 400 includes a switch 402, which may comprise, for example, a plurality of transistors of a stacked FET switch (i.e., a stacked FET switch). Further, device 400 includes a linearizer 404 coupled in parallel with switch 402. According to one exemplary embodiment, linearizer 404 may be configured to introduce distortion having an equal magnitude and an opposite phase of distortion generated by switch 402. As an example, linearizer 404 may include a varactor 406 (e.g., a metal-oxide semiconductor (MOS) varactor) having a voltage controlled capacitance (i.e., variable capacitors $C_{VAR}$) and configured to receive a tuning voltage Vtune. Linearizer 404 may also include a plurality of metal-insulator-metal (MIM) capacitors $C_{MIM}$ coupled in series with varactor 406.

As noted above, switch 402 may generate $3^{rd}$ order distortion having an amplitude and phase. Further, linearizer 404 and, more specifically, varactor 406, may generate a $3^{rd}$ order distortion, which is 180 degrees out-of-phase with respect to the phase of the $3^{rd}$ order distortion generated by switch 402. In addition, it is noted that tuning voltage Vtune may be used to adjust an amplitude of the $3^{rd}$ order distortion generated by varactor 406. Ideally, the capacitance of device 400 as a function of voltage may given by the following equation $$C(V)=C0+C1*V+C2*V^2; \quad (3)$$

wherein C0 is a base capacitance of device 400, C1 is the linear slope of the capacitance of device 400, and C2 is the coefficient for second order non-linear capacitance of device 400. It is noted that device 400 may include some residual $3^{rd}$ order non-linear capacitance.

Thus, according to one exemplary embodiment, linearizer 404 may be configured to generate $3^{rd}$ order distortion, which may be used to destructively interfere with the $3^{rd}$ order distortion generated by switch 402. More specifically, varactor 406, upon receipt of a proper tuning voltage, may generate $3^{rd}$ order distortion having equal magnitude and opposite phase (i.e., shifted 180 degrees with respect to the $3^{rd}$ order distortion of switch 402) of the $3^{rd}$ order distortion generated by switch 402 to substantially cancel the $3^{rd}$ order distortion generated by switch 402 and, thus, power efficiency of device 400 may be improved.

Further, as will be appreciated by a person having ordinary skill in the art, series MIM capacitors $C_{MIM}$ are configured to "share" the voltage drop across switch 402, thus improving reliability of varactor 406. Stated another way, the symmetric implementation of varactor 406 including the series MIM capacitors $C_{MIM}$ divides an RF voltage swing assure varactor gate to source/drain (G-S/D) break down region is avoided. Further, the impact of varactor 406 on the second order intercept (IP2) is minimal due to small distortion and/or symmetrical design, and varactor 406 causes little, if any, impact on a size of an associated DVC, and is sensitive to over corner conditions. It is noted that during an "on" state (i.e., a conductive state) of switch 402, varactor 406 is in parallel with a virtual short created by the "on" switch and, thus, may not substantially impact the "on" state third order intercept (IP3).

Figure 6:
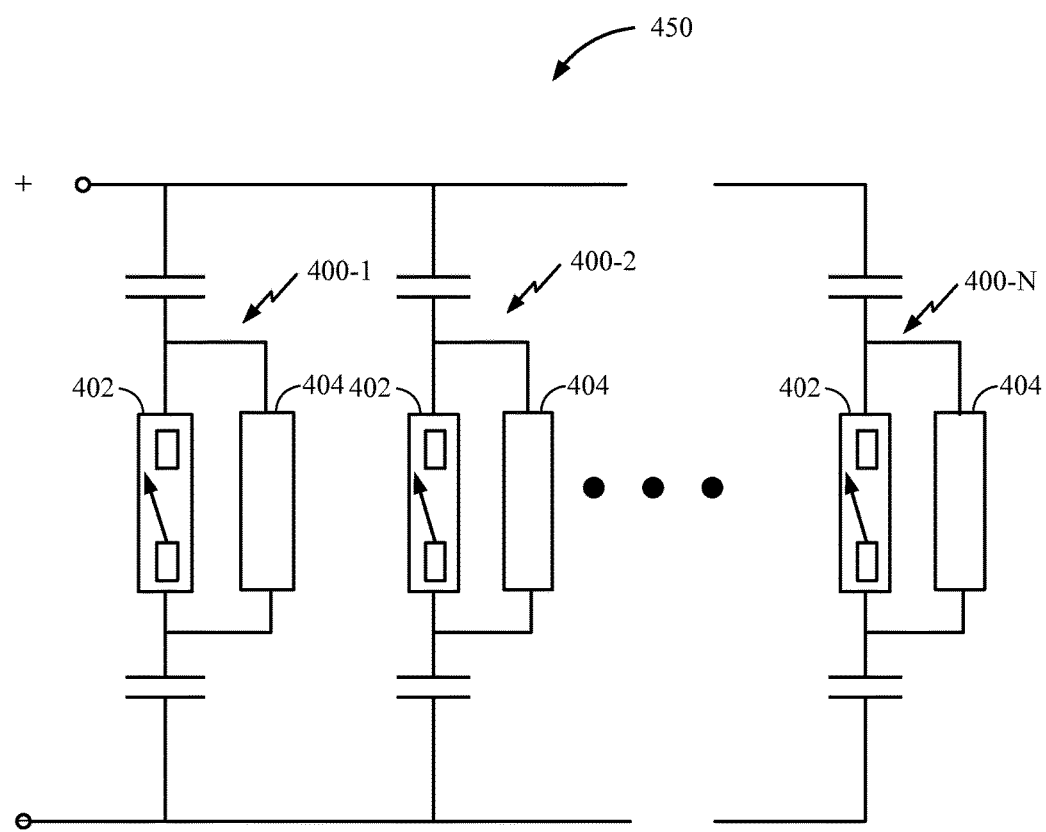
FIG. 6 illustrates a device including a plurality of switches and a plurality of linearizers, according to an exemplary embodiment of the present invention.

FIG. 6 illustrates a device 450, according to another exemplary embodiment of the present invention. Device 450, which may comprise a DVC, includes a plurality of devices 400-1-400-N, wherein each device 400-1-400-N includes switch 402 and an associated linearizer 404. It is noted that each linearizer 404 may be scaled according to a size of an associated switch 402. Further, after linearizer 404 has been optimized for a given switch size, MIM capacitors $C_{MIM}$ (not shown in FIG. 6; see FIG. 5) and varactor components (e.g., capacitors $C_{VAR}$) of linearizer 404 may be scaled linearly for other implementations. With scaled components, each switch 402/linearizer 404 pair of device 450 can share a common tuning voltage (i.e., tuning voltage Vtune; see FIG. 5) to adjust $3^{rd}$ order cancellation to account for process, voltage, and temperature effects, and therefore reduce die area for supporting hardware.

Figure 7:
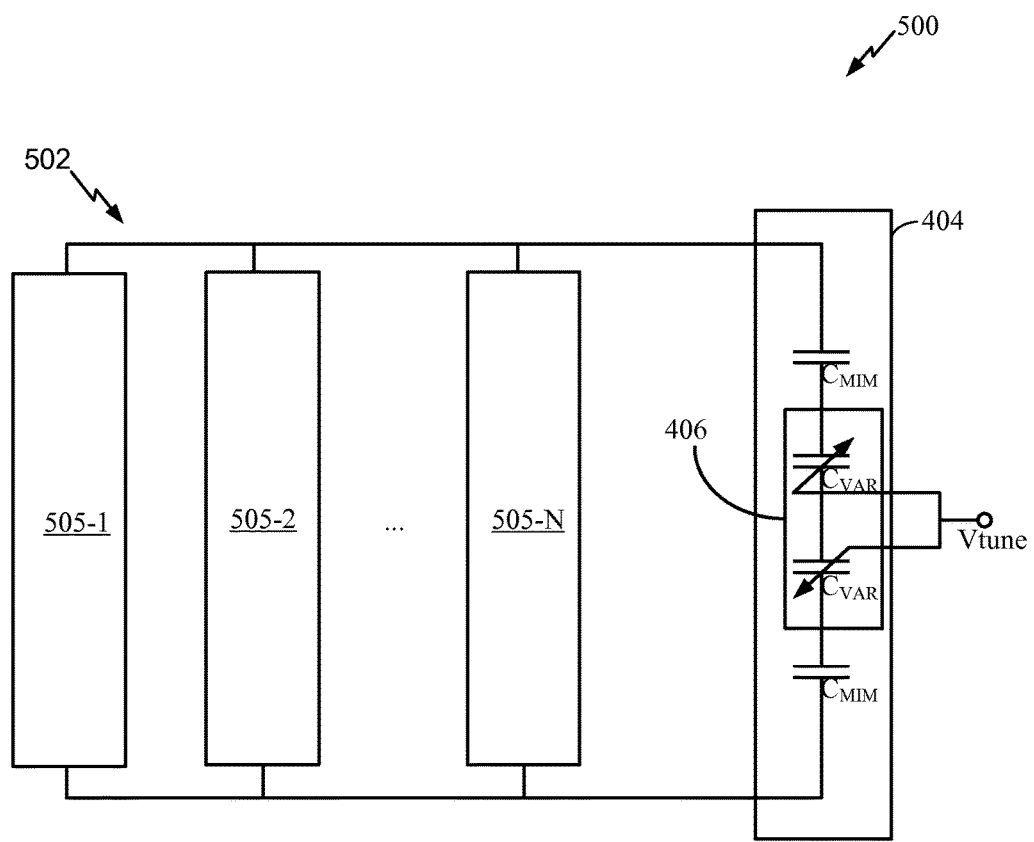
FIG. 7 illustrates a device including a digital variable capacitor circuit coupled to a linearizer, in accordance with an exemplary embodiment of the present invention.

FIG. 7 depicts a device 500, in accordance with yet another exemplary embodiment of the present invention. Device 500 includes a DVC circuit 502 and linearizer 404 coupled in parallel with DVC circuit 502. As described above, linearizer 404 includes varactor 406 and MIM capacitors $C_{MIM}$ coupled in series with varactor 406. In this exemplary embodiment, DVC circuit 502 includes a plurality of switches 505-1-505-N, wherein each switch 505-1-505-N includes a stacked FET switch. If a number of off-state switches at any given time is known, linearizer 404 may be used and tuned to cancel out the non-linear behavior of DVC circuit 502.

Figure 8:
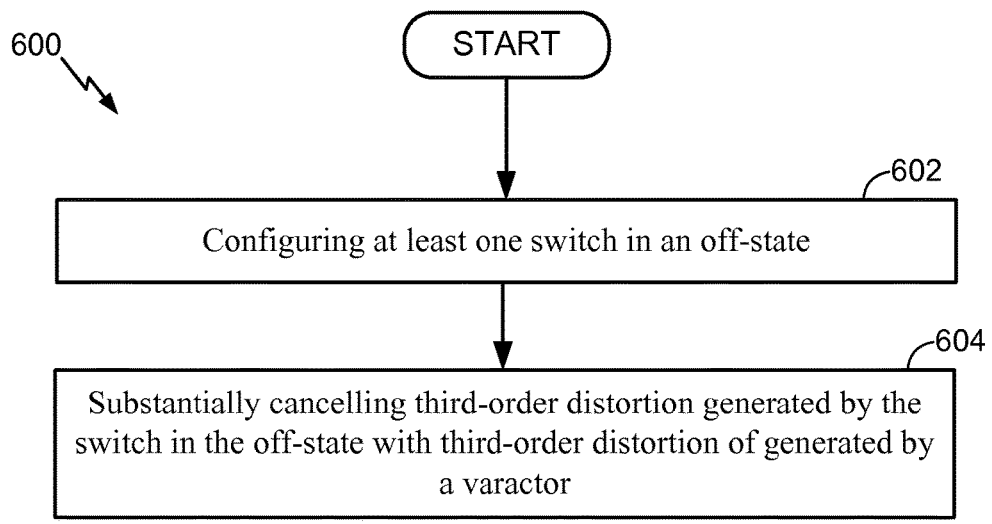
FIG. 8 is a flowchart depicting a method, in accordance with an exemplary embodiment of the present invention.

FIG. 8 is a flowchart illustrating a method 600, in accordance with one or more exemplary embodiments. Method 600 may include configuring at least one switch in an off-state (depicted by numeral 602). Method 600 may also include substantially cancelling third-order distortion generated by the switch in the off-state with third-order distortion of generated by a varactor (depicted by numeral 604).

Figure 9:
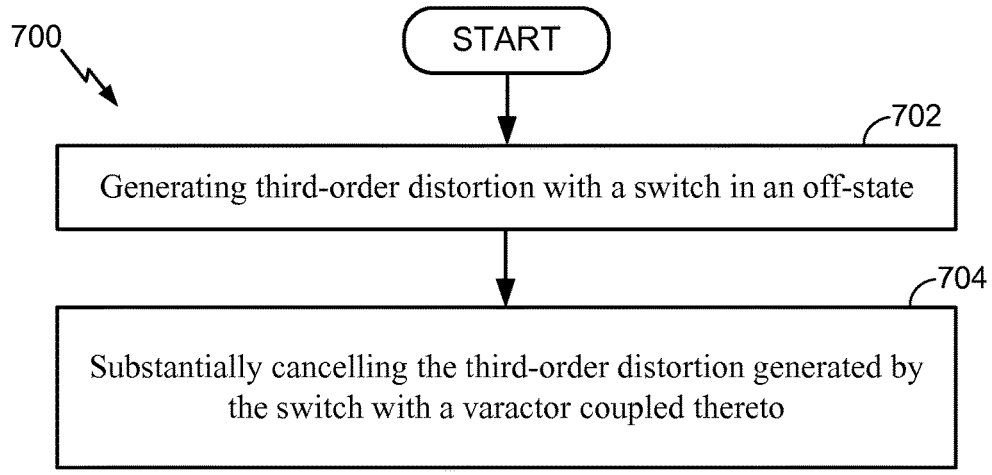
FIG. 9 is a flowchart depicting another method, in accordance with an exemplary embodiment of the present invention.

FIG. 9 is a flowchart illustrating another method 700, in accordance with one or more exemplary embodiments. Method 700 may include generating third-order distortion with a switch in an off-state (depicted by numeral 702). Method 700 may further include substantially cancelling the third-order distortion generated by the switch with a varactor coupled thereto (depicted by numeral 704).

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A device comprising:
    an antenna tuning circuit comprising a digital variable capacitor (DVC), the DVC comprising:
        a first plurality of switches coupled in series between a first terminal and a second terminal;
        a first linearizer coupled to the first terminal and to the second terminal and coupled in parallel with the plurality of switches, the linearizer comprising at least one first varactor having an adjustable capacitance responsive to a tuning voltage;
        a second plurality of switches coupled in series between the first terminal and the second terminal; and
        a second linearizer coupled between the first terminal and the second terminal, the second linearizer coupled in parallel with the second plurality of switches and comprising at least one second varactor, wherein the first linearizer is configured to compensate for $3^{rd}$ order distortion generated by the plurality of switches, and wherein the second linearizer is configured to compensate for $3^{rd}$ order distortion generated by the second plurality of switches.

2. The device of claim 1, the first plurality of switches comprising a plurality of stacked transistors.

3. The device of claim 1, the first linearizer further comprising a plurality of metal-insulator-metal (MIM) capacitors coupled in series with the at least one varactor.

4. The device of claim 1, the first linearizer configured to generate $3^{rd}$ order distortion having an amplitude substantially equal to an amplitude of $3^{rd}$ order distortion generated by the first plurality of switches and a phase substantially opposite of a phase of the $3^{rd}$ order distortion generated by the first plurality of switches.

5. The device of claim 1, the first plurality of switches configured to generate a positive $3^{rd}$ order distortion term and the first linearizer configured to generate a negative $3^{rd}$ order distortion term.

6. The device of claim 1, the first linearizer configured to generate $3^{rd}$ order distortion to destructively interfere with $3^{rd}$ order distortion generated by the first plurality of switches.

7. A method comprising:
    configuring a first plurality of switches in an off-state, the first plurality of switches coupled in series between a first terminal and a second terminal;
    cancelling at least a portion of $3^{rd}$ order distortion generated by the first plurality of switches in the off-state with distortion generated by at least one first varactor that is included in a first linearizer coupled between the first terminal and the second terminal and in parallel with the first plurality of switches, the at least one first varactor having an adjustable capacitance responsive to a tuning voltage;
    configuring a second plurality of switches coupled in series between the first terminal and the second terminal; and
    cancelling at least a portion of $3^{rd}$ order distortion generated by the second plurality of switches with distortion generated by at least one second varactor that is included in a second linearizer coupled between the first terminal and the second terminal and in parallel with the second plurality of switches.

8. The method of claim 7, wherein cancelling the at least a portion of the $3^{rd}$ order distortion generated by the first plurality of switches comprises generating $3^{rd}$ order distortion of the first varactor to constructively interfere with $3^{rd}$ order distortion generated by the first plurality of switches.

9. The method of claim 7, further comprising adjusting the tuning voltage conveyed to the first varactor to adjust a magnitude of a $3^{rd}$ order term of a capacitance of the first varactor.

10. A device comprising:
means for tuning an antenna comprising means for providing a digital variable capacitance, the means for providing the digital variable capacitance comprising:
means for configuring a first plurality of switches in an off-state, the first plurality of switches coupled in series between a first terminal and a second terminal;
means for cancelling at least a portion of $3^{rd}$ order distortion of the first plurality of switches in the off-state, the means for cancelling at least a portion of $3^{rd}$ order distortion of the first plurality of switches coupled between the first terminal and the second terminal and in parallel with the first plurality of switches, and the means for cancelling at least a portion of $3^{rd}$ order distortion of the first plurality of switches having a first adjustable capacitance based on a tuning voltage;
means for configuring a second plurality of switches coupled in series between the first terminal and the second terminal; and
means for cancelling at least a portion of $3^{rd}$ order distortion generated by the second plurality of switches, the means for cancelling at least a portion of $3^{rd}$ order distortion of the second plurality of switches coupled between the first terminal and the second terminal and in parallel with the second plurality of switches, and the means for cancelling at least a portion of $3^{rd}$ order distortion of the second plurality of switches having a second adjustable capacitance.

11. The device of claim 10, wherein the means for cancelling at least a portion of $3^{rd}$ order distortion of the first plurality of switches comprises at least one varactor.

12. The device of claim 10, the means for configuring the first plurality of switches comprising means for conveying a bias voltage to the first plurality of switches to configure the first plurality of switches in the off-state.

13. The device of claim 1, further comprising a first capacitor coupled between the first terminal and the at least one first varactor.

14. The device of claim 13, further comprising a second capacitor coupled between the second terminal and the at least one first varactor.

15. The device of claim 13, wherein the first capacitor comprises a metal-insulator-metal (MIM) capacitor.

16. The device of claim 1, wherein the at least one first varactor comprises a first variable capacitor in series with a second variable capacitor.

17. The device of claim 1, further comprising:
a first metal-insulator-metal (MIM) capacitor coupled in series with the at least one first varactor, the first MIM capacitor coupled between the first terminal and the at least one first varactor; and
a second MIM capacitor coupled in series with the first MIM capacitor and the at least one first varactor, the second MIM capacitor coupled between the second terminal and the at least one first varactor.

* * * * *